US009626460B2

(12) United States Patent
Moran et al.

(10) Patent No.: US 9,626,460 B2
(45) Date of Patent: Apr. 18, 2017

(54) METHOD FOR CREATING ACCURATE, UPDATEABLE VERTICAL RAMPS THAT FALL ON RAMP GEOMETRY IN TRANSITION AREAS OF LAMINATED COMPOSITE PARTS

(71) Applicant: Siemens Product Lifecycle Management Software Inc., Plano, TX (US)

(72) Inventors: Jonathan T. Moran, Framingham, MA (US); Weifang Hu, Shrewsbury, MA (US)

(73) Assignee: SIEMENS PRODCUT LIFECYCLE MANAGEMENT SOFTWARE INC., Plano, TX (US)

( * ) Notice: Subject to any disclaimer, the term of this patent is extended or adjusted under 35 U.S.C. 154(b) by 499 days.

(21) Appl. No.: 14/223,429

(22) Filed: Mar. 24, 2014

(65) Prior Publication Data
US 2015/0269285 A1    Sep. 24, 2015

(51) Int. Cl.
    *G06F 17/50* (2006.01)
(52) U.S. Cl.
    CPC .................. *G06F 17/50* (2013.01)
(58) Field of Classification Search
    CPC .................................... G06F 17/50
    USPC .................. 703/1; 700/97, 98; 345/419–420
    See application file for complete search history.

(56) References Cited

U.S. PATENT DOCUMENTS

| 7,010,472 | B1 * | 3/2006 | Vasey-Glandon | ...... G06F 17/50 700/97 |
| 7,196,702 | B1 * | 3/2007 | Lee | .......... G06T 17/30 345/419 |
| 8,181,345 | B2 * | 5/2012 | Carpentier | ................ B32B 5/12 29/419.1 |
| 2010/0170989 | A1 * | 7/2010 | Gray | ...................... B29C 70/30 244/123.1 |

OTHER PUBLICATIONS

EP Search Report dated Oct. 22, 2015, for EP Application 15159908.1, 8 pages.
(Continued)

*Primary Examiner* — Eunhee Kim

(57) ABSTRACT

Methods for product data management and corresponding systems and computer-readable mediums. A method includes receiving one or more layer boundaries of one or more plies of a composite part. The method includes creating a topological definition from the layer boundaries, the topological definition includes one or more vertices and half-edges. The method includes identifying one or more vertical ramp sections of one or more vertical ramps from the topological definition that form one or more discontinuities in the topological definition. The method includes adding one or more additional vertices and half-edges to the topological definition based on the layer boundaries and the vertical ramp sections. The method includes creating one or more faces in the topological definition along the vertical ramp based on the additional vertices and half-edges to resolve the discontinuities. The method includes transmitting the topological definition with the faces.

9 Claims, 15 Drawing Sheets

(56) References Cited

OTHER PUBLICATIONS

Henson M. C. et al.; "Advanced Tools for Rapid Development of Reduced Complexity Composite Structures"; Collection of technical papers—AIAA/ASME/ASCE/AHS Structures, Structural Dynamics and Materials Conference; AIAA; Washington; 2002; XP008046016; 11 pages.

Skinner et al.; "New Applications and Approaches Expand Market for Composites Software", Eiinforced Plastics, Elsevier Advanced Technology, New York, vol. 50, No. 6; Jun. 1, 2006, XP27984573A, 6 pages.

"What's new in Fibersim 2012"; www.siemens.com/plm/vistagy; Jan. 1, 2012; 3 pages.

"VISTAGY Releases FiberSIM 1-15 5.1 (R) Software for Designing Composite Products"; Retrieved from internet: http://www.6dof.com/index.php?option=com_content&rview=article&id=239%3AVISTAGY-Releases-FiberSIM-5.1%28R&29-Software-for-Designing-Composite-Products&Itemid=58; Mar. 23, 2006; 2 pages.

Anonymous: VISTAGY's New FiberSIM Software Significantly Enhances the Composites Design-to-Manufacturing Process; Retrieved from internet: http://www.cimdata.com/newsletter/2009/13/02/13.02.13.htm; Mar. 24, 2009, XP055219864, 2 pages.

* cited by examiner

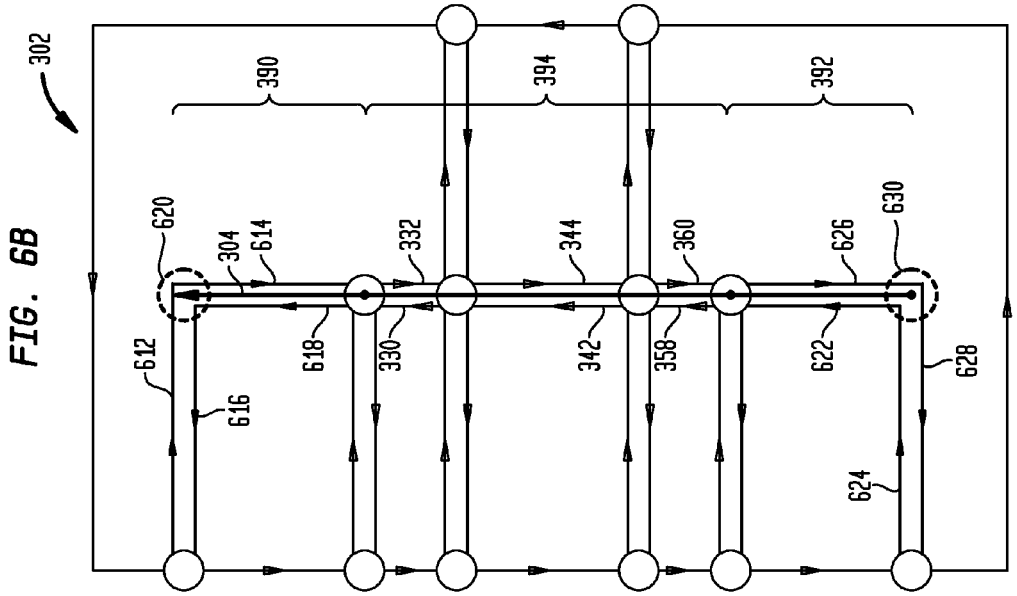
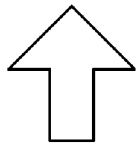
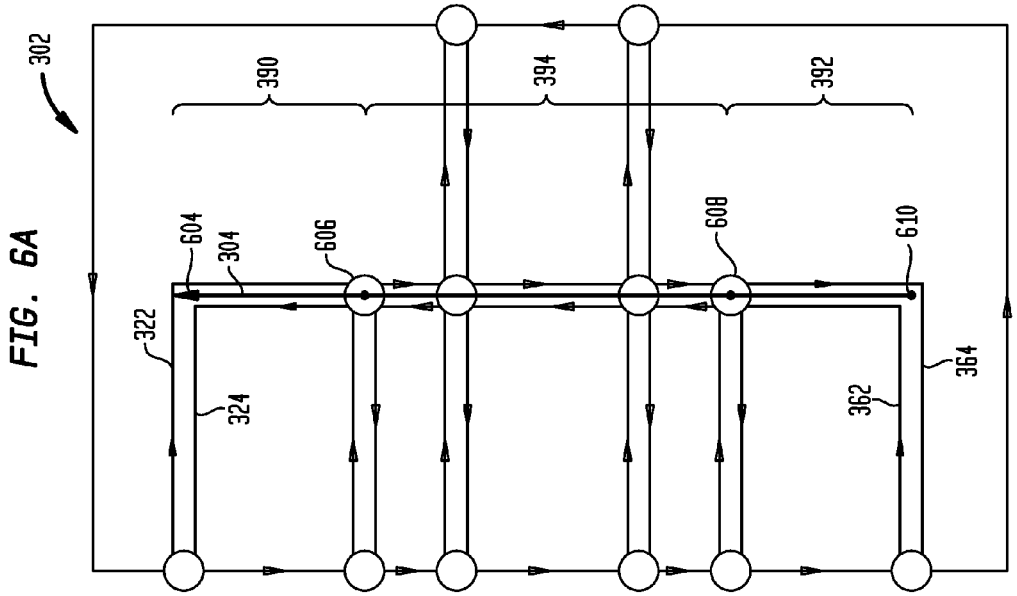

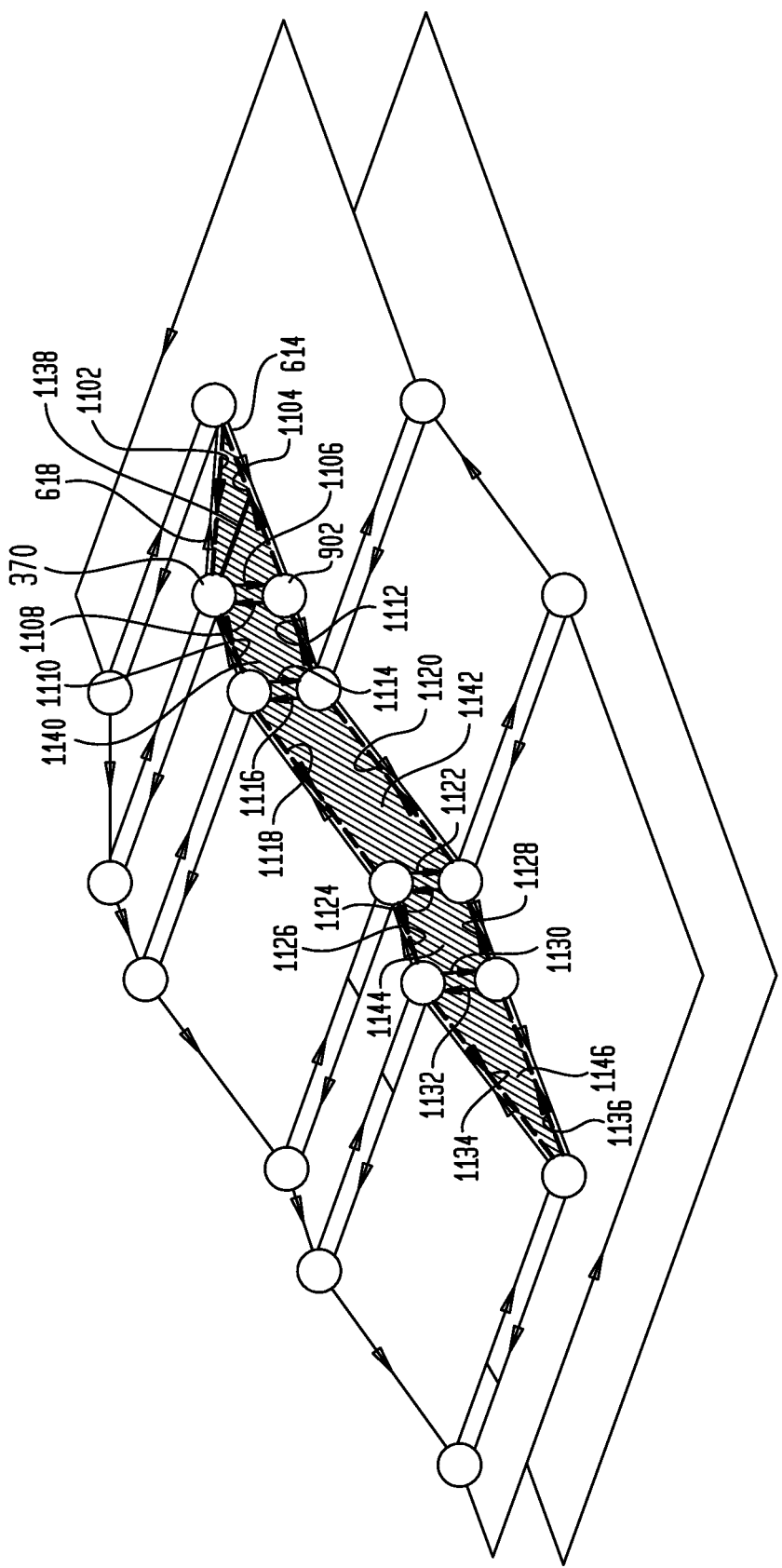

METHOD FOR CREATING ACCURATE, UPDATEABLE VERTICAL RAMPS THAT FALL ON RAMP GEOMETRY IN TRANSITION AREAS OF LAMINATED COMPOSITE PARTS

TECHNICAL FIELD

The present disclosure is directed, in general, to computer-aided design ("CAD"), visualization, and computer-aided manufacturing ("CAM") systems, product lifecycle management ("PLM") systems, and similar systems, that manage data for products and other items (collectively, "Product Data Management" systems or PDM systems).

BACKGROUND OF THE DISCLOSURE

CAD and CAM systems aid in designing and manufacturing products. Improved systems are desirable.

SUMMARY OF THE DISCLOSURE

Various disclosed embodiments include CAD methods and corresponding systems and computer-readable mediums. A method includes receiving one or more layer boundaries of one or more plies of a composite part. The method includes creating a topological definition from the layer boundaries, where the topological definition includes one or more vertices and half-edges. The method includes identifying one or more vertical ramp sections of one or more vertical ramps from the topological definition that form one or more discontinuities in the topological definition. The method includes adding one or more additional vertices and half-edges to the topological definition based on the layer boundaries and the vertical ramp sections. The method includes creating one or more faces in the topological definition along the vertical ramp based on the additional vertices and half-edges to resolve the discontinuities. The method includes transmitting the topological definition with the faces.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIGS. 6A-6B illustrate two-dimensional representations of the topological definition that has additional vertices in accordance with disclosed embodiments;

FIG. 11 illustrates a three-dimensional representation of the topological definition with additional half-edges and faces in accordance with disclosed embodiments;

DETAILED DESCRIPTION

Figure 1:
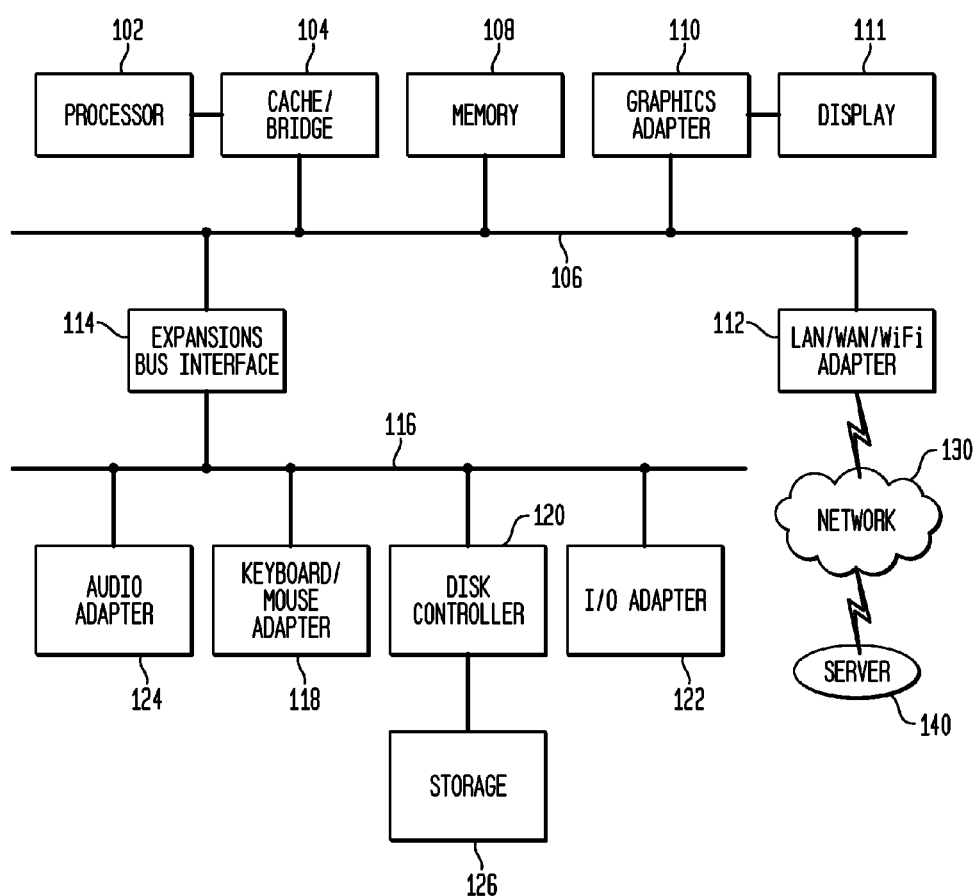
FIG. 1 illustrates a block diagram of a data processing system in which an embodiment can be implemented.

FIGS. 1 through 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

A laminated composite part, also referred to as a composite part, can be defined as a set of zones of constant thickness, drop-off driven transitions between zones, and transition corner-treatment vertices. A set of material specifications linked to each zone implicitly define layers of composite material partially covering the composite part. The layer shapes defined by sets of layers covering the same set of connected zones can define the constant thickness areas of the composite part. Ramps can occur where the layers in a given layer shape drop off gradually from the thicker to the thinner constant thickness areas that surround it, or where the layers drop off at the same location. Vertical ramp areas can be defined by the layers that drop off at the same location forming a ramp with a surface that is substantially perpendicular to the plane of the layer. Non-vertical ramps can be defined by the layers that drop off gradually, and by the rate at which the layers drop off.

A logical representation of a composite part can generally be defined via the layup surface on which the layers of material are to be built up. One of the design deliverables can be the solid generated by offsetting the constant thickness areas connected with exact ramp surface geometry. The logical representation of the composite part, together with the input geometry of the layup surface and the zone boundaries, can define the ramp construction geometry. The ramp construction geometry in turn can drive the creation of the ramp surface geometry.

An on-surface topological definition for the offset surface regions and ramps can be defined from the logical representation of the composite part. Each vertical ramp can be represented by either an open or closed curve on the on-surface topological definition. Because a vertical ramp can occur when the layers in a constant thickness zone drop off in the same location, all curves representing vertical ramps can lie on the boundaries of existing regions in the on-surface topological definition.

Within the on-surface topological definition, adjacent regions can have the same thickness wherever the two regions are in contact, e.g., the bottom of ramp thickness and the thickness of the thinner constant thickness area. When the vertical ramps are added to the topological definition, the regions on either side of the vertical ramp curve can be decoupled, such that they are no longer required to have the same thickness. Instead, the difference in thickness on either side of the vertical ramp curve can be equal to the height of the vertical ramp. The process of computing the offsets of the constant thickness areas, and ramps can then proceed as normal.

FIG. 1 illustrates a block diagram of a data processing system in which an embodiment can be implemented, for example as a CAD, PLM, or PDM system particularly configured by software or otherwise to perform the processes as described herein, and in particular as each one of a plurality of interconnected and communicating systems as described herein. The data processing system illustrated includes a processor 102 connected to a level two cache/bridge 104, which is connected in turn to a local system bus 106. Local system bus 106 may be, for example, a peripheral component interconnect (PCI) architecture bus. Also connected to local system bus 106 in the illustrated example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, touchscreen, etc.

Those of ordinary skill in the art will appreciate that the hardware illustrated in FIG. 1 may vary for particular implementations. For example, other peripheral devices, such as an optical disk drive and the like, also may be used in addition or in place of the hardware illustrated. The illustrated example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Figure 2:
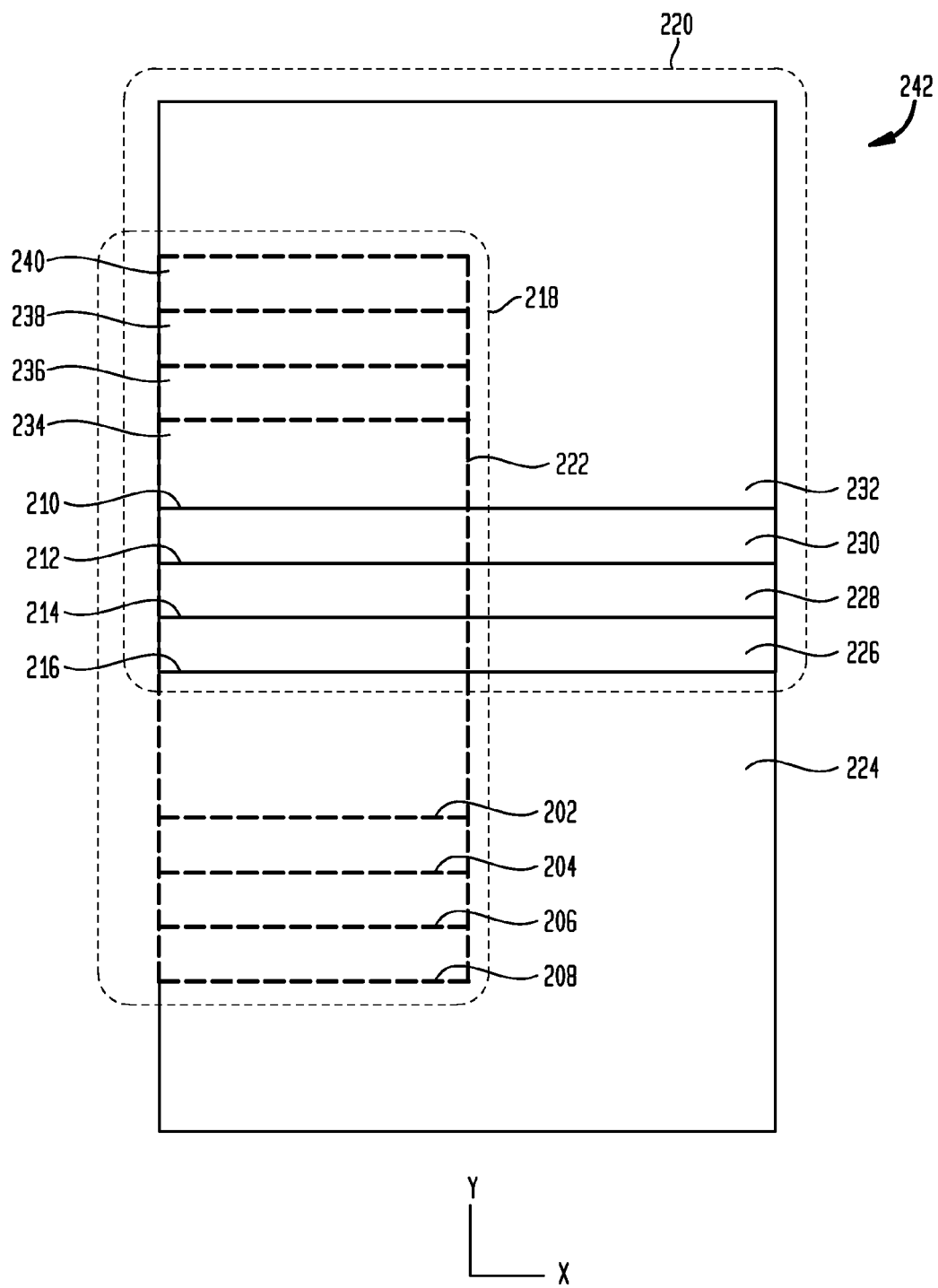
FIG. 2 illustrates the layer boundaries of one or more plies of a laminated composite part in accordance with disclosed embodiments.

FIG. 2 illustrates the layer boundaries 202-216 of one or more plies 224-240 of a laminated composite part 242 in accordance with disclosed embodiments. The plies have been grouped into two layer groups 218 and 220. Note that the zero-distance dropoff of the layers 202-208 of the group 218 can result in a vertical ramp that forms discontinuity 222 where boundaries 202-208 overlap. For purposes of discussion, the horizontal axis of FIG. 2 can correspond to the x coordinate axis of the plies and the vertical axis of FIG. 2 can correspond to the y coordinate axis of the plies.

Figure 3:
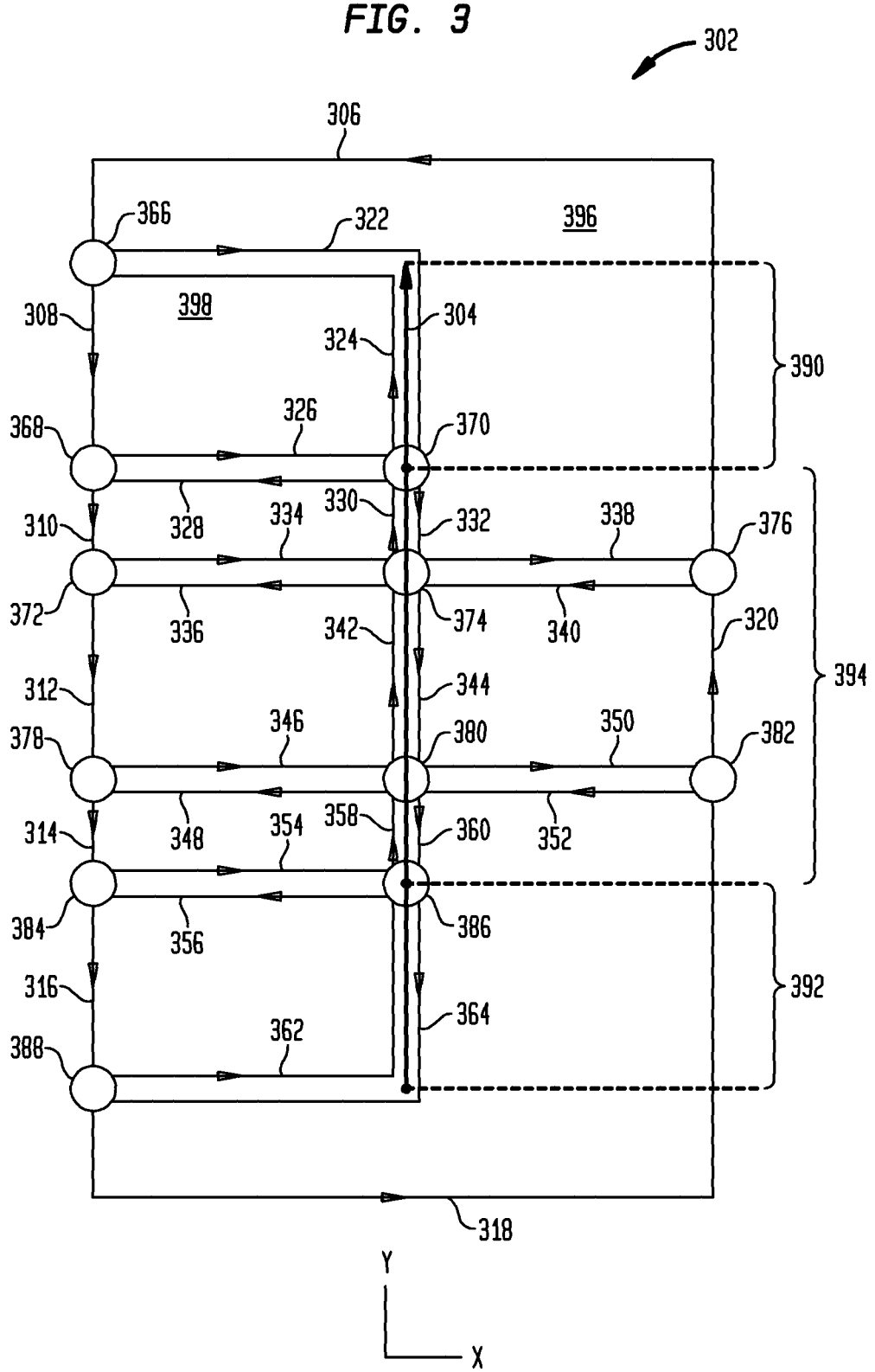
FIG. 3 illustrates a two-dimensional representation of the topological definition, including a vertical ramp in accordance with disclosed embodiments.

FIG. 3 illustrates a two-dimensional representation of the topological definition 302, including the vertical ramp 304 in accordance with disclosed embodiments. The topological definition 302 can include the unpaired outer half-edges 306-320 at the outermost portions of the topological definition 302. The topological definition 302 can include the paired inner half-edges 322-364 that are inside of the space defined by the outer half-edges 306-320. Each of the half edges 306-364 (inner and outer) can extend between two of the vertices 366-388.

The on-surface topological definition 302 can be used to record the adjacency relationships between constant thickness areas and ramp areas, and the adjacency relationship between ramp areas of a laminated composite part. The topological definition 302 can be represented by a doubly-connected edge list data structure. Each vertex 366-388 can correspond to a point on the surface, each half-edge 306-364 can correspond to a curve on the surface, and each face surrounded by half-edges can correspond to a constant area (e.g., the face 396 surrounded by the half-edges 306, 322, 332, and 338) or ramp area (e.g., the face 398 surrounded by the half-edges 324, 308, and 326). The vertical ramp 304 can include two ramp areas 390 and 392 and a constant thickness area 394.

For purposes of discussion, the horizontal axis of FIG. 3 can correspond to the x coordinate axis of the topological definition 302 and the vertical axis of FIG. 3 can correspond to the y coordinate axis of the topological definition 302, similar to the plies and boundaries illustrated in FIG. 2.

Figure 4:
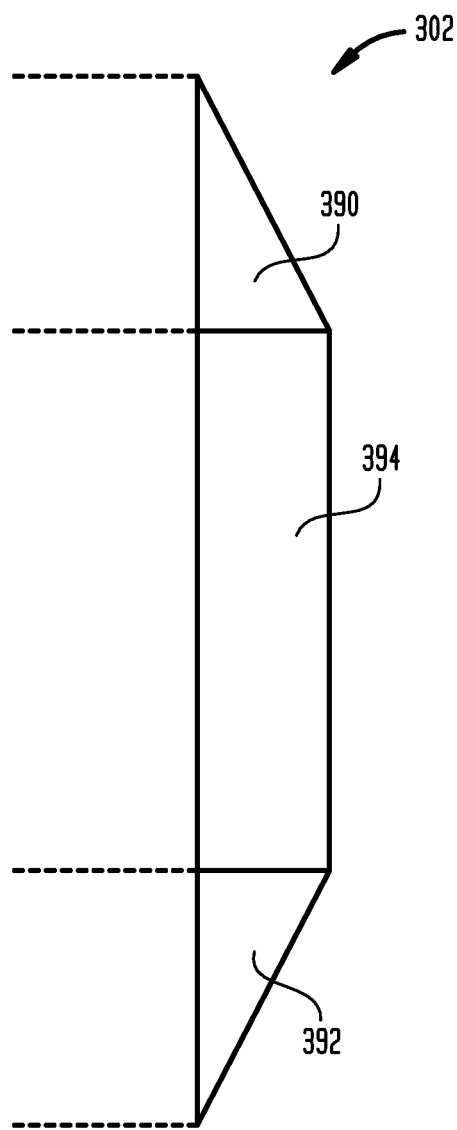
FIG. 4 illustrates a cross-sectional view of the vertical ramp in accordance with disclosed embodiments.

FIG. 4 illustrates a cross-sectional view of the vertical ramp 302 created by the plies of the group 218 of FIG. 2 in accordance with disclosed embodiments. The vertical ramp 302 can include two ramp areas 390 and 392, and the vertical ramp 302 can include a constant thickness area 394.

For purposes of discussion, the horizontal axis of FIG. 4 can correspond to the z coordinate axis of the vertical ramp 302 and the vertical axis of FIG. 4 can correspond to the y coordinate axis of the vertical ramp 302 to illustrate the cross sectional profile of the vertical ramp.

FIGS. 5A-5G illustrate different types of vertical ramps in accordance with disclosed embodiments. Vertical ramps can be computed from the layer shapes of one or more plies stacked on top of each other. Each vertical ramp can be made up of one, two, or three sections, which may be either "rectangular" or "triangular". Each section can correspond to an oriented curve on the surface. Rectangular sections can be defined as sections of the vertical ramp curve in which the height of the vertical ramp is constant. Triangular sections can be defined as sections of the vertical ramp curve in which the height of the vertical ramp is non-constant; triangular vertical ramps can be further divided by whether the height of the vertical ramp is increasing or decreasing. The height of the vertical ramp at the smallest end of a triangular section can be zero.

Figure 5A:
FIGS. 5A-5G illustrate different types of vertical ramps in accordance with disclosed embodiments.
Figure 5B:
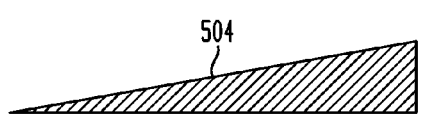
Figure 5C:
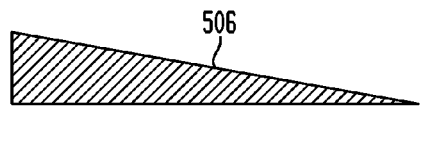
Figure 5D:
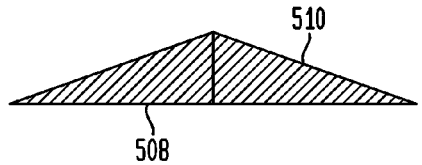
Figure 5E:
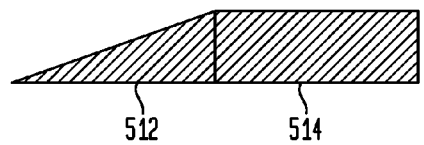
Figure 5F:
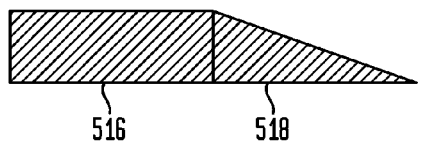
Figure 5G:
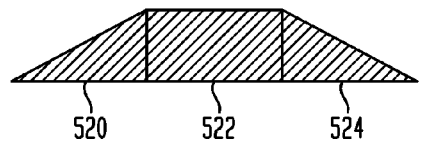

Every ramp can have one of the following configurations of sections: (1) one rectangular section 502, as illustrated in FIG. 5A, wherein the curve is either closed, or begins and ends at the edge of the part; (2) one increasing triangular section 504, as illustrated in FIG. 5B, wherein the curve ends at the edge of the part; (3) one decreasing triangular section 506, as illustrated in FIG. 5C, wherein the curve begins at the edge of the part; (4) one increasing triangular section 508 and one decreasing triangular section 510, as illustrated in FIG. 5D; (5) one increasing triangular section 512 and one rectangular section 514, as illustrated in FIG. 5E, wherein the curve ends at the edge of the part; (6) one rectangular section 516 and one decreasing triangular section 518, as illustrated in FIG. 5F, wherein the curve begins at the edge of the part; and (7) one increasing triangular section 520, one rectangular section 522, and one decreasing triangular section 524, as illustrated in FIG. 5G.

FIGS. 6A-6B illustrate two-dimensional representations of the topological definition 302 that has additional vertices in accordance with disclosed embodiments. Each of the half-edges, including one or more of the half-edges 322-364, can be compared to the endpoints 604-610 of the vertical ramp sections 390-394. Wherever a vertical ramp section endpoint lies on a half-edge such that the vertical ramp section endpoint does not lie on one of the half-edge's endpoints or vertices, the single pair of half-edges can be split into two pairs of half-edges and a new vertex can be created at the vertical ramp section endpoint. For example, the vertical ramp section endpoint 604 does not lie on an endpoint or vertex of half-edges 322 and 324, as shown in FIG. 6A. The half-edge 322 can be split into the half-edges 612 and 614, the half-edge 324 can be split into the half-edges 616 and 618, and vertex 620 can be created at the vertical ramp section endpoint 604, as shown in FIGS. 6A and 6B. Similarly, the vertical ramp section endpoint 610 does not lie on an endpoint or vertex of half-edges 362 and 364, as shown in FIG. 6A. The half-edge 362 can be split into the half-edges 622 and 624, the half-edge 324 can be split into the half-edges 626 and 628, and the vertex 630 can be created at the vertical ramp section endpoint 610, as shown in FIGS. 6A and 6B. Each of the newly split pair of half-edges can be added to the list of half-edges that can be compared against the vertical ramp endpoints that have not yet been checked.

A pair of maps can be computed that can identify which half-edges are associated with the one or more vertical ramps in the topological definition. The topological definition 302 can include the single vertical ramp 304. The first map of the pair of maps can be a mapping from the half-edges to the vertical ramps. The second map of the pair of maps can be a mapping from the vertical ramps to the half-edges. The half-edges 618, 330, 342, 358, and 622 can be mapped to the vertical ramp 304 in the first map and the vertical ramp 304 can be mapped to the half-edges 618, 330, 342, 358, and 622 in the second map.

For both the first map and the second map, each corresponding pair of half-edge and vertical ramp within the first map or the second map can have the property that a curve of the half-edge can overlap, and can be oriented in the same direction as, the triangular or rectangular section of one or more of the vertical ramps. Because the half-edges were already split by the vertical ramp section endpoints, a vertical ramp cannot overlap a portion of a half-edge and must overlap with the entire half-edge for each half-edge that the vertical ramp section overlaps. This is not true from the perspective of the half-edge in that a half-edge can, and often will, overlap with a portion of the vertical ramp section. The half-edge 618 can overlap the entire vertical ramp section 390 and the vertical ramp section 390 can overlap the entirety of half-edge 618. The half-edges 330, 342, and 358 each can overlap a portion of the vertical ramp section 394 and the vertical ramp section 394 can overlap the entirety of each of the half-edges 330, 342, and 358. The half-edge 622 can overlap the entire vertical ramp section 392 and the vertical ramp section 392 can overlap the entirety of the half-edge 622.

Figure 7:
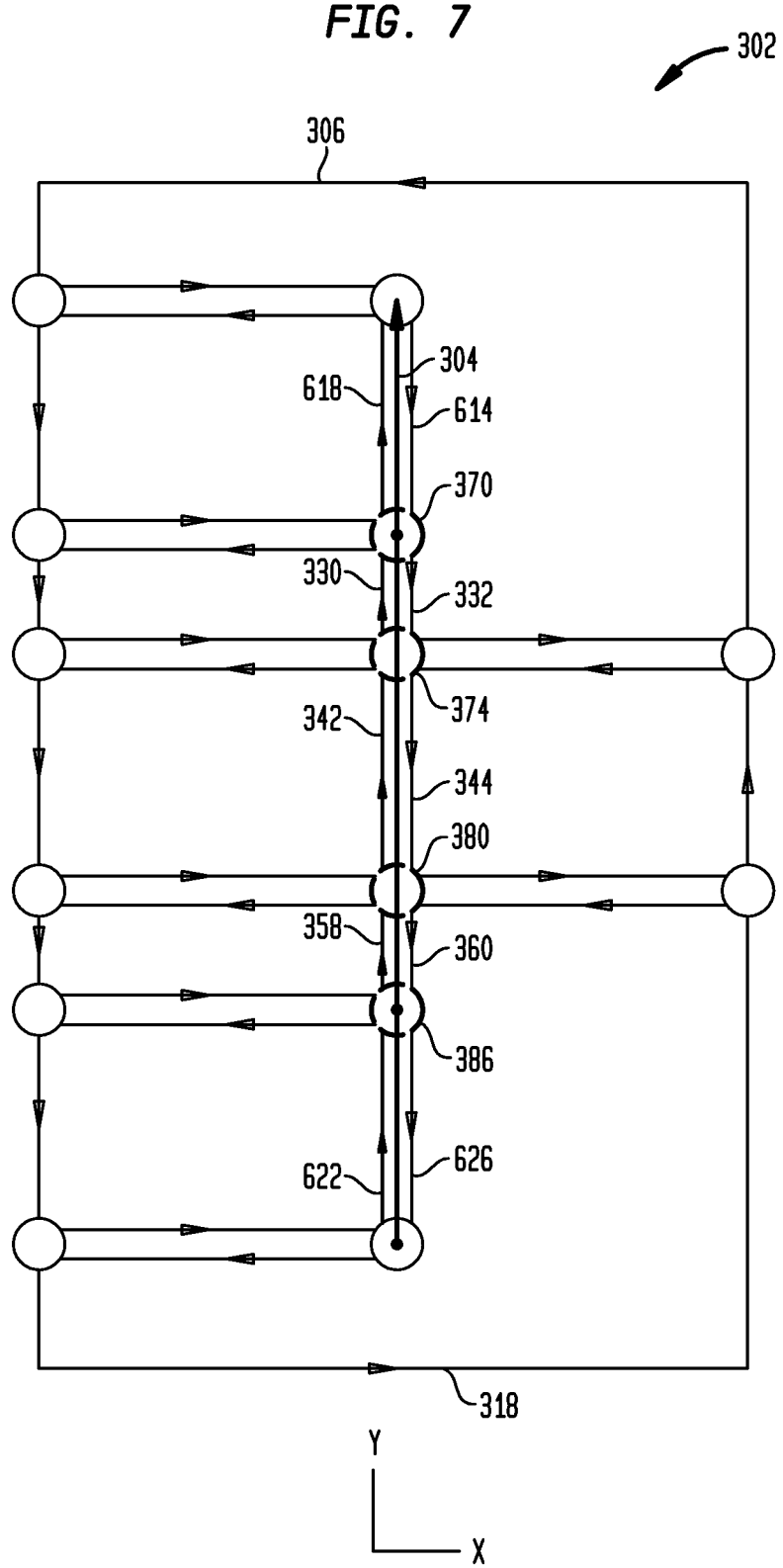
FIG. 7 illustrates a two-dimensional representation of the topological definition with identified vertical vertices in accordance with disclosed embodiments.

FIG. 7 illustrates a two-dimensional representation of the topological definition 302 with identified vertical vertices in accordance with disclosed embodiments. For the vertical ramp 304 of the topological definition 302, the half-edges 618, 330, 342, 358, and 622 that are mapped to the vertical ramp 304 can be retrieved and sorted to form a chain associated with the vertical ramp 304. This process can be repeated for each vertical ramp in the topological definition to form one or more chains of half-edges.

The vertices 370, 374, 380, and 386 between adjacent half-edges in the chain of the half-edges 618, 330, 342, 358, and 622 can be found. This process can be repeated for each chain that is formed. The vertices 370, 374, 380, and 386 between adjacent half-edges in the chain can be referred to as "vertical vertices". The vertices of the topological definition can include vertical vertices that correspond to respective vertical ramps. A vertical vertex can lie on more than one vertical ramp.

Figure 8:
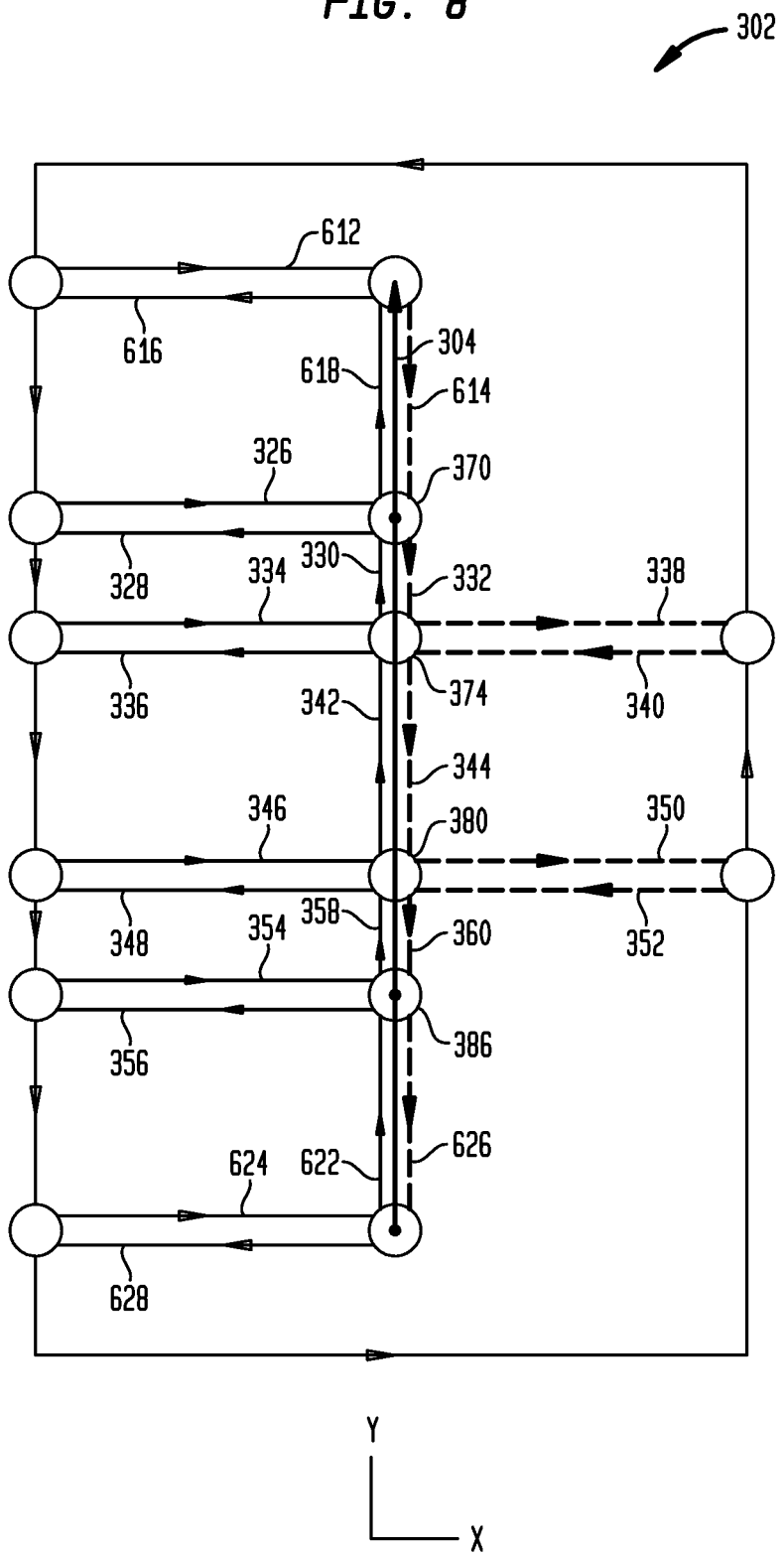
FIG. 8 illustrates a two-dimensional representation of the topological definition with identified inside half-edges and outside half-edges in accordance with disclosed embodiments.

FIG. 8 illustrates a two-dimensional representation of the topological definition 302 with identified inside half-edges and outside half-edges in accordance with disclosed embodiments. For the pair of the vertical ramp 304 with the vertical vertex 370, the half-edges 618, 614, 326-328, and 330-332 that are connected to the vertical vertex 370 in the pair can be found. This can be repeated for each vertical vertex of each vertical ramp of the topological definition 302.

Each of the found half-edges can be determined to be either "inside" or "outside" of the vertical ramp 304 based on the orientation of the vertical ramp curve. The half-edges 618, 326, 328, 330, 334, 336, 342, 346, 348, 358, 354, 356, and 622 can be inside the vertical ramp 304 and the half-edges 614, 332, 338, 340, 344, 350, 352, 360, and 626 can be outside the vertical ramp 304. This process can be performed for every vertical ramp in the part. The results can be stored before any further changes are made to the topological definition 302 in order to correctly handle the cases of intersecting or overlapping vertical ramps.

For the pair of the vertical ramp 304 and the vertex 370, which lies on the vertical ramp 304, it can be determined that the half-edges 618, 614, 326-328, and 330-332 that are connected to the vertical vertex 370 include inside half-edges 618, 326, 328, and 330 and includes outside half-edges 614 and 332. The vertical vertex 370 can be identified as a vertex to be cloned because it includes both inside half-edges and outside half-edges. This process can be repeated for each vertical vertex 374, 380, and 386 and for each vertical vertex of each vertical ramp of the topological definition.

Figure 9:
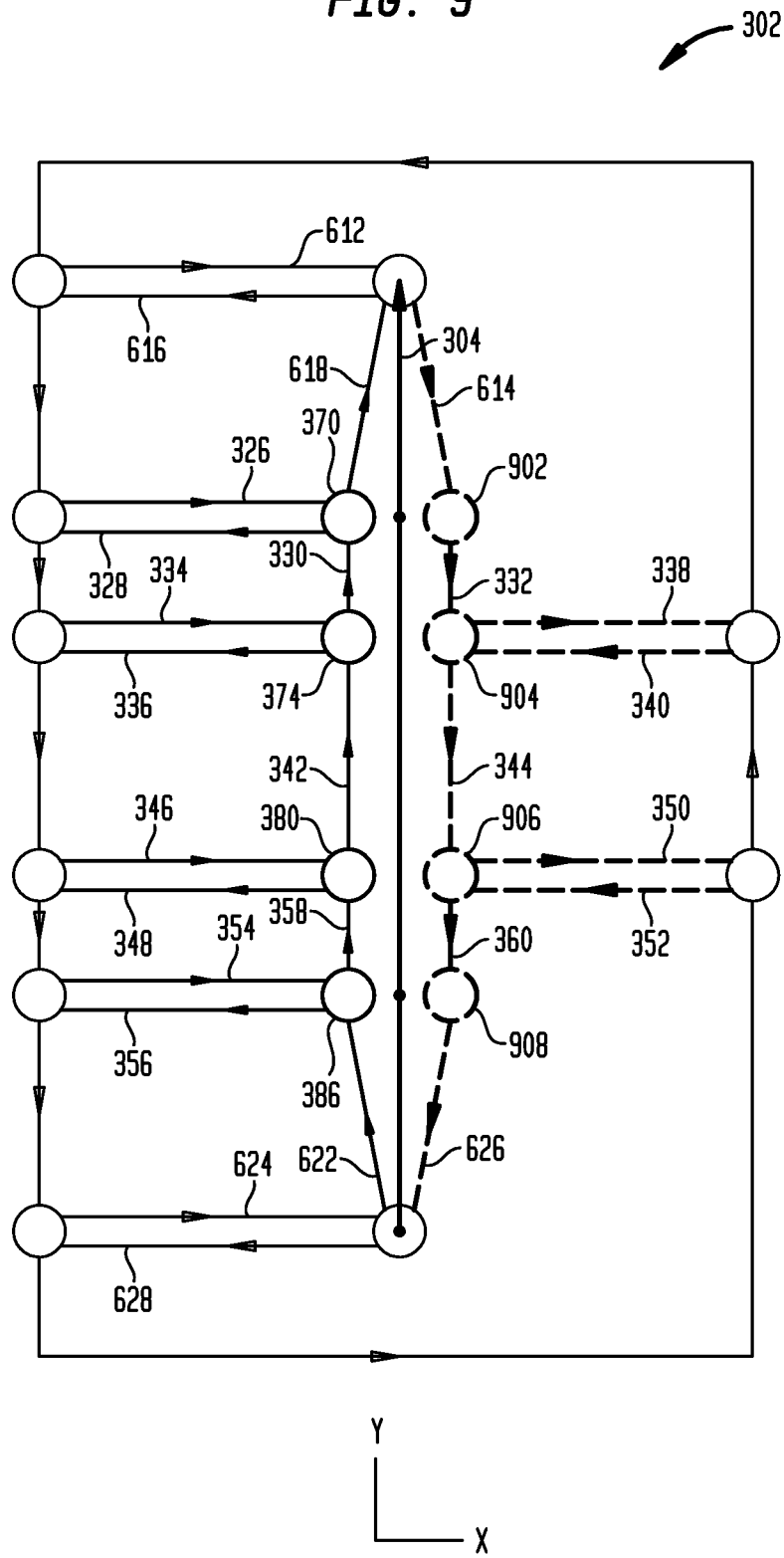
FIG. 9 illustrates a two-dimensional representation of the topological definition with cloned vertical vertices in accordance with disclosed embodiments.

FIG. 9 illustrates a two-dimensional representation of the topological definition 302 with cloned vertical vertices in accordance with disclosed embodiments. The vertical vertices 902, 904, 906, and 908 can be added to the topological definition and/or cloned from the vertical vertices 370, 374, 380, and 386 after determining that the vertical vertices 370, 374, 380, and 386 are each connected to both inside half-edges and outside half-edges. This process can be repeated for each vertical vertex of each vertical ramp of the topological definition.

The inside half-edges 618, 326, 328, and 330 can be linked to the vertex 370 and the outside half edges 614 and 332 can be linked to the vertical vertex 902. This process of the inside half-edges being linked to one vertical vertex and the outside half-edges are linked to the other can be repeated for each vertical vertex that was cloned.

The vertical vertex 370 and the cloned vertical vertex 902 can have a difference in their respective heights equal to the height of the vertical ramp 304. The vertical vertex 370 can be at the top of the vertical ramp 304 and the vertical vertex 902 can be at the bottom of the vertical ramp 304. For clarity, the vertical vertex 370 and the cloned vertical vertex 902 are shown as non-overlapping. Each vertical vertex having a common ancestry can be included in a set. The sets illustrated in the example of FIG. 9 include {370, 902}, {374, 904}, {380, 906}, and {386, 908}. Certain embodiments can include more than two vertices in a set. When there are more than two vertices in the set, the new half-edges are created between the vertices adjacent in the list ordered by thickness, i.e. between the first and second, second and third, third and fourth The half-edge 618 can be unlinked from its twin half-edge 614 to allow the half-edges 618 and 614 to have different thicknesses or lengths. This process of unlinking can be repeated for the half-edges 330-332, 342-344, 358-360, 622-626 and for each half-edge that lies on the one or more vertical ramps of the topological definition.

Figure 10:
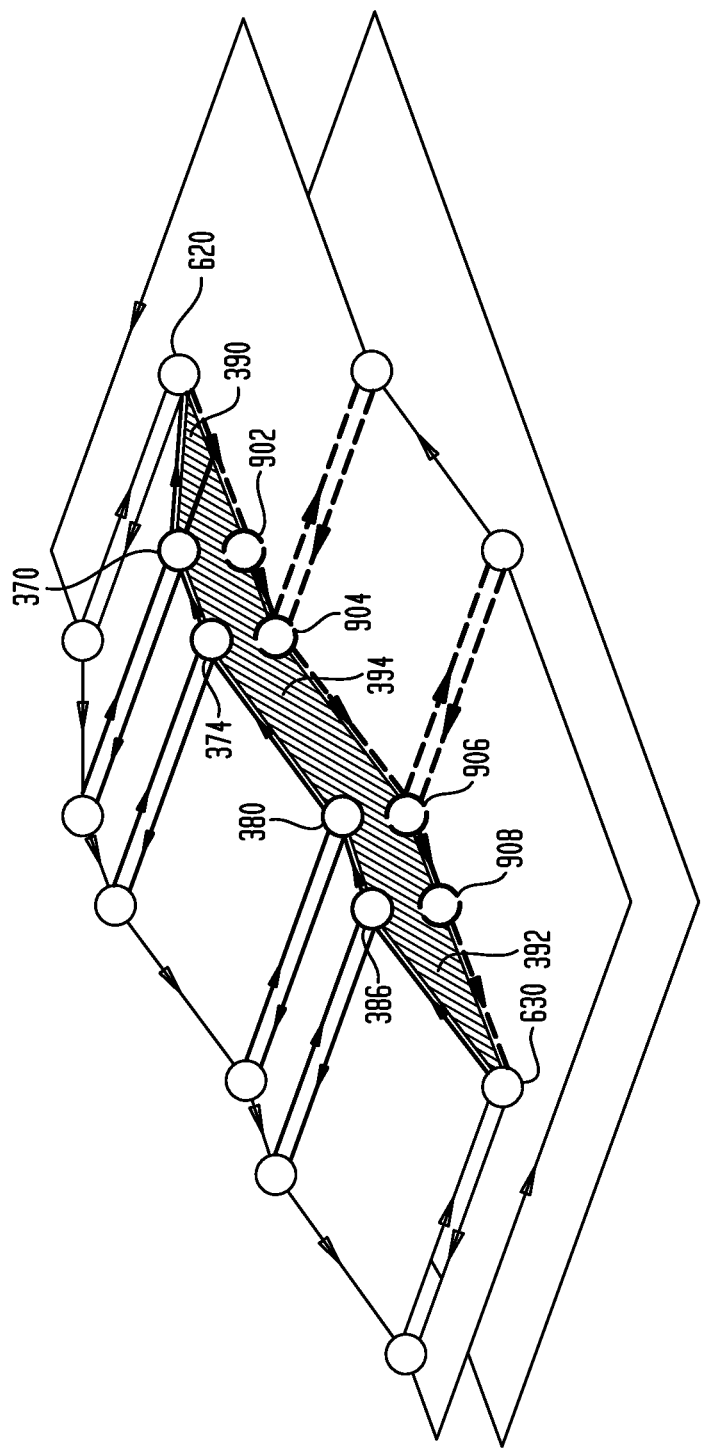
FIG. 10 illustrates a three-dimensional representation of the topological definition in accordance with disclosed embodiments.

FIG. 10 illustrates a three-dimensional representation of the topological definition 302 in accordance with disclosed embodiments.

Offset thicknesses for the constant thickness area 394 and the ramp areas 390 and 392 can be computed. Offset thicknesses can be computed for each of the one or more constant thickness areas and ramp areas of the topological definition. The vertical ramp 304 is illustrated as a disconnected region, i.e., the region between the vertices 620, 370, 374, 380, 386, 630, 908, 906, 904, and 902 that does not yet include one or more faces.

FIG. 11 illustrates a three-dimensional representation of the topological definition 302 with additional half-edges and faces in accordance with disclosed embodiments. The additional half-edges 1102-1136 and faces 1138-1146 can be created between the vertices fill in the disconnected region in the topological definition 302. The creation of additional half-edges and faces can be repeated for each vertical ramp of the topological definition.

The cloned vertical vertices can be ordered by thickness within their respective sets. The half-edges 1106-1108 oriented in opposite directions can be created between the vertical vertices 370 and 902. This process can be repeated for each pair of original vertical vertex and cloned vertical vertex for each vertical ramp of the topological definition.

The half-edge 1102 can be created as a twin to the half-edge 618, which was unlinked from the half-edge 614. The half-edge 1102 can link to the same vertices as the half-edge it was created from, i.e., the half-edge 614, which links to the vertices 620 and 370 as shown in FIGS. 10 and 11. The half-edge 1104 can be created as a twin to the half-edge 614, which was unlinked from the half-edge 618. The half-edge 1104 can link to the same vertices as the half-edge it was created from, i.e., the half-edge 614, which links to the vertices 620 and 902 as shown in FIGS. 10 and 11. This process can be repeated for each half-edge that was unlinked from its twin half-edge.

The face 1138 can be created from the loops of newly created half-edges 1102, 1106, and 1104. The face 1138 can be within the vertical ramp section 390; the faces 1140, 1142, and 1144 can be within the vertical ramp section 394; and the face 1146 can be within the vertical ramp section 392. This process of creating faces from loops of half-edges can be repeated for each loop of newly created half-edges to create faces that fill in the disconnected portion of the topological definition created by the vertical ramp 304.

The geometry for the offset surfaces for constant thickness areas, vertical and non-vertical ramps can then be created from the topological definition 302 that has been modified to include additional half-edges and faces to fill in the one or more disconnected regions created by one or more vertical ramps.

FIGS. 12A-12D illustrate vertex cloning when two or more vertical ramps intersect or overlap in accordance with disclosed embodiments. The vertical ramps 1202 and 1204 can intersect at the vertical vertex 1206.

Figure 12A:
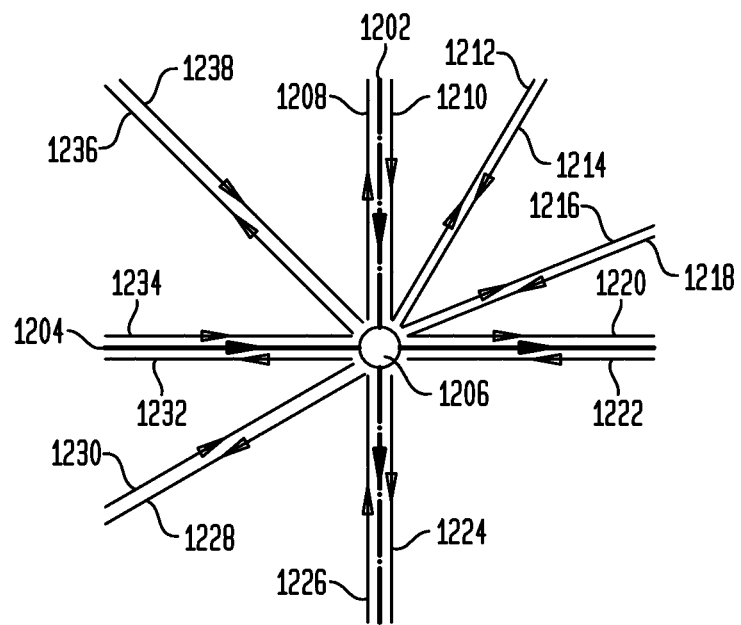
FIGS. 12A-12D illustrate vertex cloning when two or more vertical ramps intersect or overlap in accordance with disclosed embodiments.

FIG. 12A illustrates the vertical vertex 1206, the half-edges 1208-1238 connected to the vertical vertex 1206, and the vertical ramps 1202 and 1204.

The half-edges 1210-1224 can be inside the vertical ramp 1202 and are illustrated as being to the right of the vertical ramp 1202. The half-edges 1226-1238 and 1208 can be outside the vertical ramp 1202 and are illustrated as being to the left of the vertical ramp 1202.

The half-edges 1234-1238 and 1208-1220 can be inside the vertical ramp 1204 and are illustrated as being above the vertical ramp 1202. The half-edges 1222-1232 can be outside the vertical ramp 1202 and are illustrated as being below the vertical ramp 1204.

Figure 12B:
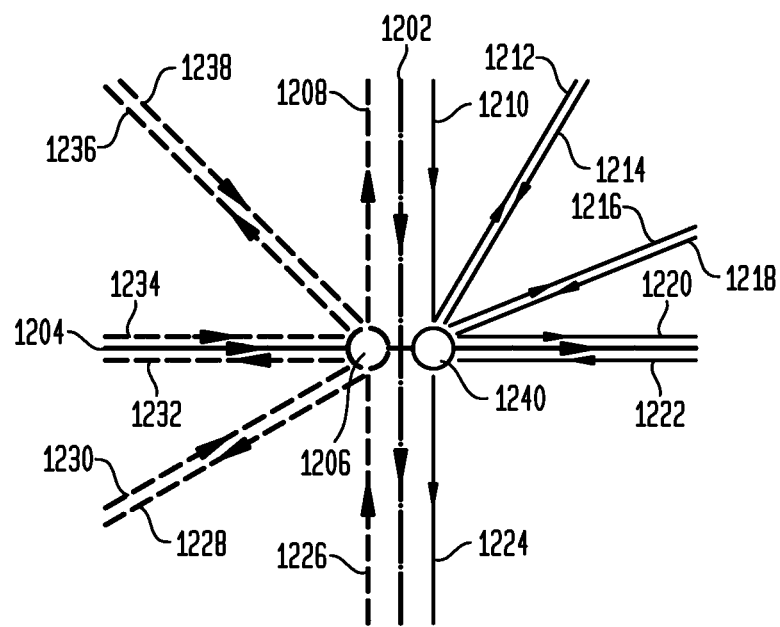

FIG. 12B illustrates the result of processing the vertical vertex 1206 and the vertical ramp 1202. The vertical vertex 1206 can be cloned to form the vertical vertex 1240. The half-edges 1210-1224 inside the vertical ramp 1202 can be linked to the vertical vertex 1240 and the half-edges 1226-1238 and 1208 outside the vertical ramp 1202 can be linked to the vertical vertex 1206.

Figure 12C:
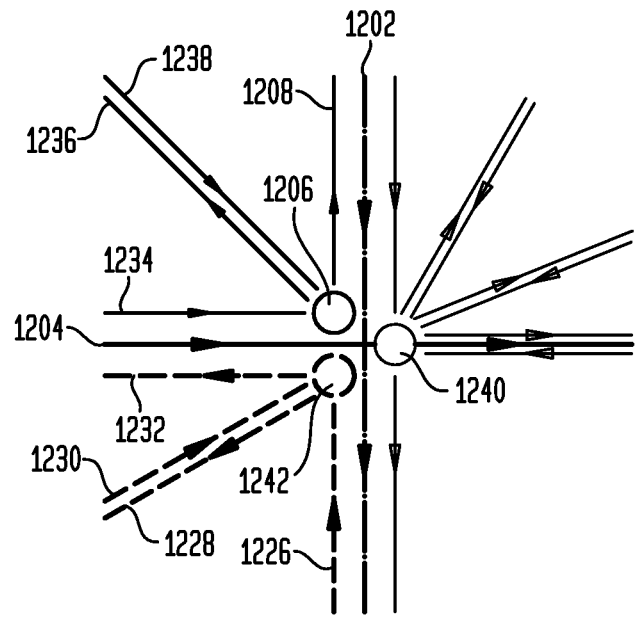

FIG. 12C illustrates the result of processing the vertical vertex 1206 and the vertical ramp 1204 after the vertical vertex 1206 and the vertical ramp 1202 were processed. The vertical vertex 1206 can be cloned (again) to form the vertical vertex 1242, but only the half-edges 1226-1238 and 1208 that were linked to the vertical vertex 1206 (see FIG. 12B) are processed. The half-edges 1234-1238 and 1208 inside (above) the vertical ramp 1204 can be linked to the vertical vertex 1206 and the half-edges 1226-1232 outside (below) the vertical ramp 1204 can be linked to the vertical vertex 1242.

Figure 12D:
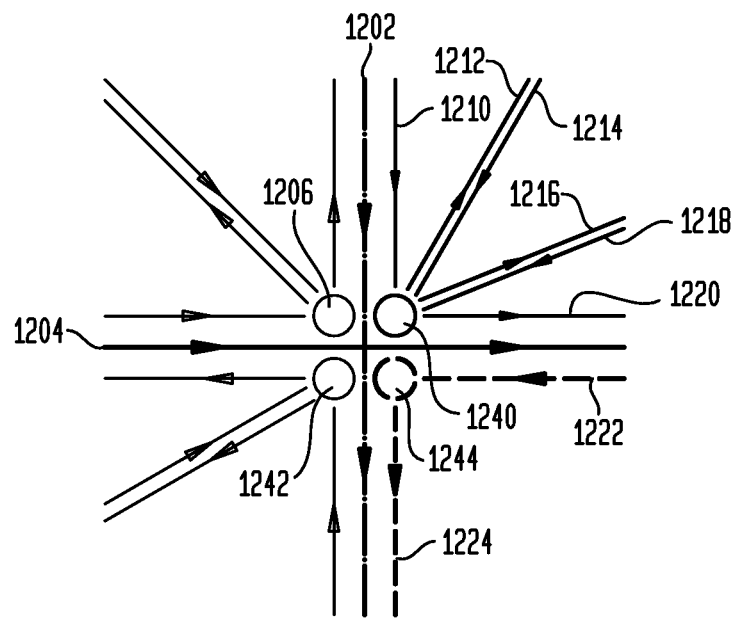

FIG. 12D illustrates the result of processing the vertical vertex 1240 and the vertical ramp 1204 after the vertical vertex 1206 and the vertical ramp 1202 were processed creating the vertical vertex 1240. The vertical vertex 1240 can be cloned to form the vertical vertex 1244, but only the half-edges 1210-1224 that were linked to the vertical vertex 1240 (see FIG. 12C) are processed. The half-edges 1210-1220 inside (above) the vertical ramp 1204 can be linked to the vertical vertex 1240 and the half-edges 1222-1224 outside (below) the vertical ramp 1204 can be linked to the vertical vertex 1244.

This process of vertex cloning and half-edge linking can be repeated for each vertex of each overlapping or intersecting vertical ramps in the topological definition. The set of vertical vertices with common ancestry for FIG. 12 is {1206, 1240, 1242, 1244}. New half-edges can be created between the vertices that are adjacent in the list ordered by thickness, i.e. between the first and second, second and third, third and fourth.

Figure 13:
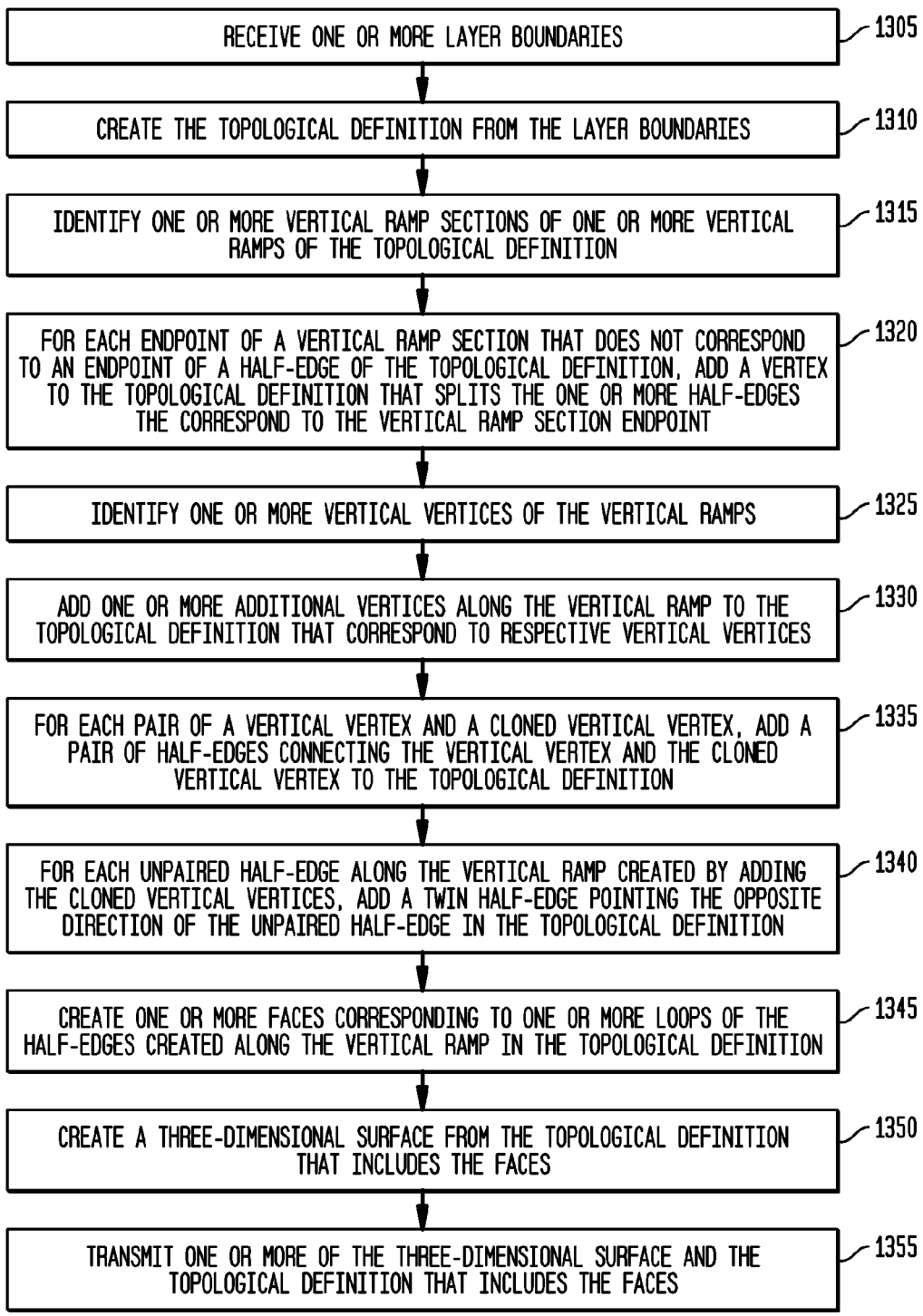
FIG. 13 illustrates a flowchart of a process in accordance with disclosed embodiments that may be performed, for example, by a CAD system as disclosed herein.

FIG. 13 illustrates a flowchart of a process in accordance with disclosed embodiments that may be performed, for example, by a CAD system as disclosed herein.

The system, such as the data processing system of FIG. 1, can receive one or more layer boundaries (step 1305) of one or more plies of a composite part. Each layer boundary can define the size, shape, location, position, and so on of a layer of composite material for a laminated composite part. The layer boundaries can also include a three-dimensional order of the layers. Receiving, as used herein, can include retrieving from storage, receiving from another device or process, receiving via an interaction with a user, or otherwise.

The system can create or receive a topological definition from the layer boundaries (step 1310). The topological definition can include one or more vertices and one or more half-edges. The vertices can indicate the endpoints of one or more half-edges. The half-edges can indicate where two ramps of different slopes meet and/or where a ramp and a constant thickness area meet.

The system can identify one or more vertical ramp sections of one or more vertical ramps of the topological definition (step 1315) from the topological definition that form one or more discontinuities in the topological definition. Vertical ramps can be formed where multiple layers end on a common boundary line. Each vertical ramp can include one or more sections, wherein each section can have a constant thickness or a change in thickness.

For each endpoint of a vertical ramp section that does not correspond to an endpoint of a half-edge of the topological definition, the system can add a vertex to the topological definition that can split the one or more half-edges that correspond to the vertical ramp section endpoint (step 1320). The added vertices can ensure that each vertical ramp section endpoint corresponds to a vertex.

The system can identify one or more vertical vertices of the vertical ramps (step 1325). The vertical vertices of a vertical ramp can be identified by finding the chain of half-edges that lie along the vertical ramp and identifying the vertices of the chain that are between adjacent half-edges of the chain.

The system can add one or more additional vertices along the vertical ramp to the topological definition that correspond to respective vertical vertices (step 1330) based on the layer boundaries and the vertical ramp sections. The additional vertices can include cloned vertices that are cloned from the vertical vertices. The cloned or additional vertices can include an added vertex added for an endpoint of a vertical ramp section that does not correspond an endpoint of a half-edge of the topological definition. The adding of the added vertex can split a half-edge that corresponds to the endpoint of the vertical ramp section. For the half-edges linked to the original vertical vertex, the system can adjust the links of the half-edges so that the half-edges that were inside of the vertical ramp are linked to one of the original vertical vertex or the cloned vertical vertex and the half-edges that were outside of the vertical ramp are linked to the other of the original vertical vertex or the cloned vertical vertex. If a pair of half-edges included an inside half-edge and an outside half-edge, the pair can be split so that the inside half-edge and the outside half-edge can have different lengths. The original vertical vertex and the cloned vertical vertex can be given different thicknesses so that the difference in the thicknesses of the original vertical vertex and the cloned vertical vertex is the same as the thickness of the vertical ramp at the original vertical vertex and the cloned vertical vertex.

For each pair of a vertical vertex and a cloned vertical vertex, the system can add a pair of half-edges connecting the vertical vertex and the cloned vertical vertex to the topological definition (step 1335) based on the layer boundaries and the vertical ramp sections. The half-edges of the pair can point in opposite directions and can allow for creation of a face of the vertical ramp. The vertical vertex and the cloned vertical vertex can have a difference in height equal to a height of the vertical ramp.

For each unpaired half-edge along the vertical ramp created by adding the cloned vertical vertices, the system can add a twin half-edge pointing the opposite direction of the unpaired half-edge in the topological definition (step 1340). The twin half-edges can allow for creation of a face of the vertical ramp.

The system can create one or more faces in the topological definition along the vertical ramp based on the additional vertices and half-edges to resolve the discontinuities (step 1345). The faces can fill in the discontinuous area created by the vertical ramp.

The system can create a three-dimensional surface from the topological definition that includes the faces (step 1350). The three-dimensional surface can be used by a computer aided design (CAD) program to model the part corresponding to the plurality of layer boundaries received by the system.

The system can transmit one or more of the three-dimensional surface and the topological definition that includes the faces (step 1355). One or more of the processor 102, the memory 108, and a program running on the processor 102 can transmit the three-dimensional surface and/or the topological definition via one or more of the local system bus 106, the adapter 112, the network 130, the server 140, the interface 114, the I/O bus 116, the disk controller 120, the storage 126, and so on. In certain embodiments, a CAD program running on the processor 102 can transmit the three-dimensional surface to the display 111 via the local system bus 106 and graphics adapter 110. In certain embodiments, the CAD program running on the processor 102 can transmit the three-dimensional surface to the memory 108 or the storage 126 via the local system bus 106 and I/O bus 116. Receiving, as used herein, can include retrieving from storage, receiving from another device or process, receiving via an interaction with a user, or otherwise.

Figure 14:
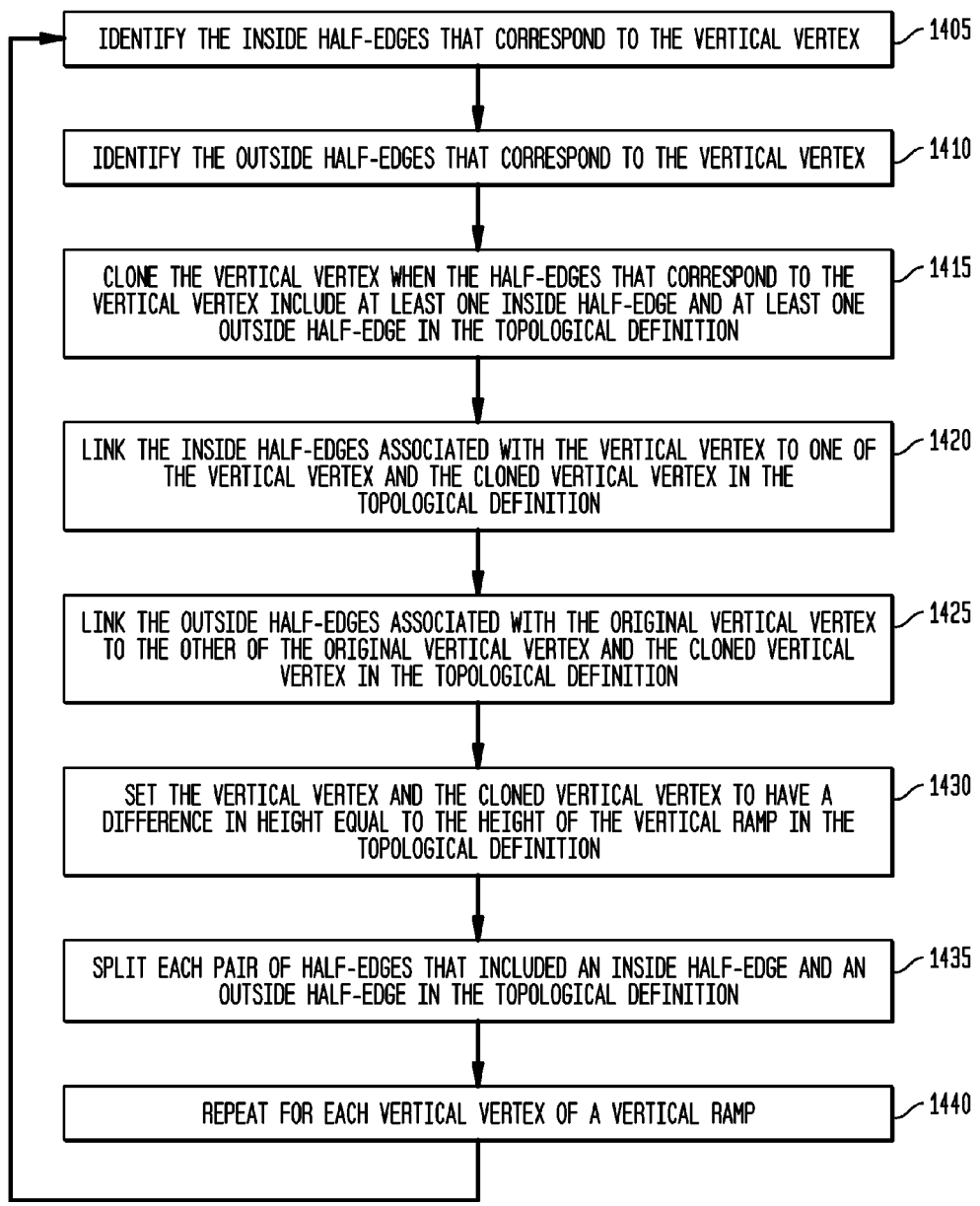
FIG. 14 illustrates a flowchart of a process in accordance with disclosed embodiments that may be performed, for example, by a CAD system as disclosed herein.

FIG. 14 illustrates a flowchart of a process in accordance with disclosed embodiments that may be performed, for example, by a CAD system as disclosed herein. After identifying a vertical vertex, the system can process the vertical vertex according to the steps of the flowchart of FIG. 14.

The system can identify the inside half-edges that correspond to the vertical vertex (step 1405). As used herein, a half-edge can be inside when it is at a top of a vertical ramp.

The system can identify the outside half-edges that correspond to the vertical vertex (step 1410). As used herein, a half-edge is outside when it is at a bottom of a vertical ramp.

The system can clone the vertical vertex when the half-edges that correspond to the vertical vertex include at least one inside half-edge and at least one outside half-edge in the topological definition (step 1415). One of the original vertical vertex or the cloned vertical vertex can correspond to the top of the vertical ramp, and the other of the original vertical vertex or the cloned vertical vertex can correspond to the bottom of the vertical ramp.

The system can link the inside half-edges associated with the vertical vertex to one of the vertical vertex and the cloned vertical vertex in the topological definition (step 1420). The system can link the outside half-edges associated with the original vertical vertex to the other of the original vertical vertex and the cloned vertical vertex in the topological definition (step 1425). The original half-edges can be linked to different vertices with the internal half-edge is linked to one of the vertices and the external half-edge is linked to the other vertex.

The system can set the vertical vertex and the cloned vertical vertex to have a difference in height equal to the height of the vertical ramp in the topological definition (1430). The original vertical vertex and one or more vertical vertices cloned from the original vertical vertex form a set that is ordered by the thicknesses of the vertical vertices in the set.

The system can split each pair of half-edges that included an inside half-edge and an outside half-edge in the topological definition (step (1435). The original half-edges are split so that the internal half-edge is linked to one of the vertices can have a length different from the external half-edge linked to the other vertex.

The system can repeat the process for each vertical vertex of a vertical ramp (step 1440). Each original vertical vertex can be cloned to form a set of vertical vertices.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being illustrated or described herein. Instead, only so much of a data processing system as is unique to the present disclosure or necessary for an understanding of the present disclosure is illustrated and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for product data management to create a three-dimensional model of a laminated composite part, the method performed by a data processing system and comprising:

receiving one or more layer boundaries of one or more plies of a laminated composite part, wherein each layer boundary defines the size, the shape, the location and position of a layer composite material for the laminated composite part;

creating a topological definition from the layer boundaries, the topological definition includes one or more vertices and half-edges, wherein the half-edges are curves corresponding to portions of edges of layer boundaries;

identifying one or more vertical ramp sections of one or more vertical ramps from the topological definition that form one or more discontinuities in the topological definition, wherein the vertices include vertical vertices that correspond to vertices at the location of respective vertical ramps;

adding one or more additional vertices and half-edges to the topological definition based on the layer boundaries and the vertical ramp sections, wherein the additional vertices include cloned vertical vertices that are cloned from the vertical vertices, wherein for a pair of a vertical vertex and a cloned vertical vertex, a pair of half-edges are added to the topological definition between the vertical vertex and the cloned vertical vertex, wherein the vertical vertex and the cloned vertical vertex have a difference in height equal to a height of the vertical ramp;

creating one or more faces in the topological definition along the vertical ramp based on the additional vertices and half-edges to resolve the discontinuities;

creating a three-dimensional surface from the topological definition that includes the faces; and transmitting the three-dimensional surface and the topological definition with the faces.

2. The method of claim 1, wherein the additional vertices include an added vertex added for an endpoint of a vertical ramp section that does not correspond an endpoint of a half-edge of the topological definition.

3. The method of claim 2, wherein the adding of the added vertex splits a half-edge that corresponds to the endpoint of the vertical ramp section.

4. A data processing system to create a three-dimensional model of a laminated composite part comprising:

a processor; and an accessible memory, the data processing system particularly configured to:

receive one or more layer boundaries of one or more plies of a laminated composite part, wherein each layer boundary defines the size, the shape, the location and position of a layer composite material for the laminated composite part;

create a topological definition from the layer boundaries, the topological definition includes one or more vertices and half-edges, wherein the half-edges are curves corresponding to portions of edges of layer boundaries;

identify one or more vertical ramp sections of one or more vertical ramps from the topological definition that form one or more discontinuities in the topological definition, wherein the vertices include vertical vertices that correspond to vertices at the location of respective vertical ramps;

add one or more additional vertices and half-edges to the topological definition based on the layer boundaries and the vertical ramp sections, wherein the additional vertices include cloned vertical vertices that are cloned from the vertical vertices, wherein for a pair of a vertical vertex and a cloned vertical vertex, a pair of half-edges are added to the topological definition between the vertical vertex and the cloned vertical vertex, wherein the vertical vertex and the cloned vertical vertex have a difference in height equal to a height of the vertical ramp;

create one or more faces in the topological definition along the vertical ramp based on the additional vertices and half-edges to resolve the discontinuities;

create a three-dimensional surface from the topological definition that includes the faces; and transmit the three-dimensional surface and the topological definition with the faces.

5. The data processing system of claim 4, wherein the additional vertices include an added vertex added for an endpoint of a vertical ramp section that does not correspond an endpoint of a half-edge of the topological definition.

6. The data processing system of claim 5, wherein the adding of the added vertex splits a half-edge that corresponds to the endpoint of the vertical ramp section.

7. A non-transitory computer-readable medium encoded with executable instructions that, when executed, cause one or more data processing systems to create a three-dimensional model of a laminated composite part via a method comprising:

receive one or more layer boundaries of one or more plies of a laminated composite part, wherein each layer boundary defines the size, the shape, the location and position of a layer composite material for the laminated composite part;

create a topological definition from the layer boundaries, the topological definition includes one or more vertices and half-edges, wherein the half-edges are curves corresponding to portions of edges of layer boundaries;

identify one or more vertical ramp sections of one or more vertical ramps from the topological definition that form one or more discontinuities in the topological definition, wherein the vertices include vertical vertices that correspond to vertices at the location of respective vertical ramps;

add one or more additional vertices and half-edges to the topological definition based on the layer boundaries and the vertical ramp sections, wherein the additional vertices include cloned vertical vertices that are cloned from the vertical vertices, wherein for a pair of a vertical vertex and a cloned vertical vertex, a pair of half-edges are added to the topological definition between the vertical vertex and the cloned vertical vertex, wherein the vertical vertex and the cloned vertical vertex have a difference in height equal to a height of the vertical ramp;

create one or more faces in the topological definition along the vertical ramp based on the additional vertices and half-edges to resolve the discontinuities;

create a three-dimensional surface from the topological definition that includes the faces; and transmit the three-dimensional surface and the topological definition with the faces.

8. The computer-readable medium of claim 7, wherein the additional vertices include an added vertex added for an endpoint of a vertical ramp section that does not correspond an endpoint of a half-edge of the topological definition.

9. The computer-readable medium of claim 8, wherein the adding of the added vertex splits a half-edge that corresponds to the endpoint of the vertical ramp section.

* * * * *